United States Patent [19]
Honda

[11] Patent Number: 5,853,496
[45] Date of Patent: Dec. 29, 1998

[54] TRANSFER MACHINE, TRANSFER METHOD, CLEANING MACHINE, AND CLEANING METHOD

[75] Inventor: Yoshiyuki Honda, Kanzakimachi, Japan

[73] Assignee: Tokyo Electron Limited, Tokyo, Japan

[21] Appl. No.: 691,233

[22] Filed: Aug. 2, 1996

[30] Foreign Application Priority Data

Aug. 8, 1995 [JP] Japan ................................ 7-222548

[51] Int. Cl.[6] .............................. B08B 7/04; B08B 3/00; B08B 1/02
[52] U.S. Cl. ............................. 134/18; 134/76; 134/26; 134/32; 134/42; 134/84; 134/94.1; 118/429; 118/500; 118/698
[58] Field of Search .......................... 134/902, 84, 94.1, 134/102.1, 102.3, 60, 57 R, 166 R, 76, 18, 26, 32; 427/430.1; 414/938, 940, 941; 118/429, 698, 500

[56] References Cited

U.S. PATENT DOCUMENTS 5,301,700 4/1994 Kamikawa et al. ..................... 134/76

*Primary Examiner*—Ponnathapura Achutamurthy
*Assistant Examiner*—P. Ponnaluri
*Attorney, Agent, or Firm*—Oblon, Spivak, McClelland, Maier & Neustadt, P.C.

[57] ABSTRACT

A transfer machine having a pair of holding members disposed opposite to each other to hold a plurality of objects arranged at their peripheral edges. A drive mechanism selectively moves the holding members toward and away from each other in order to selectively hold and release the objects by the holding members. A transfer mechanism transfers the objects and the holding members to a bath in order to process the objects in the bath. Each of the holding members has a plurality of holding notches for holding the peripheral edges of the objects, and the notches are disposed in upper and lower holders which are arranged parallel to each other. The holding notches of the upper holder have a first taper part positioned adjacent an opening of the notch and a second taper part positioned adjacent a notch bottom, and the first taper part has an opening angle larger than an opening angle of the second taper part.

22 Claims, 9 Drawing Sheets

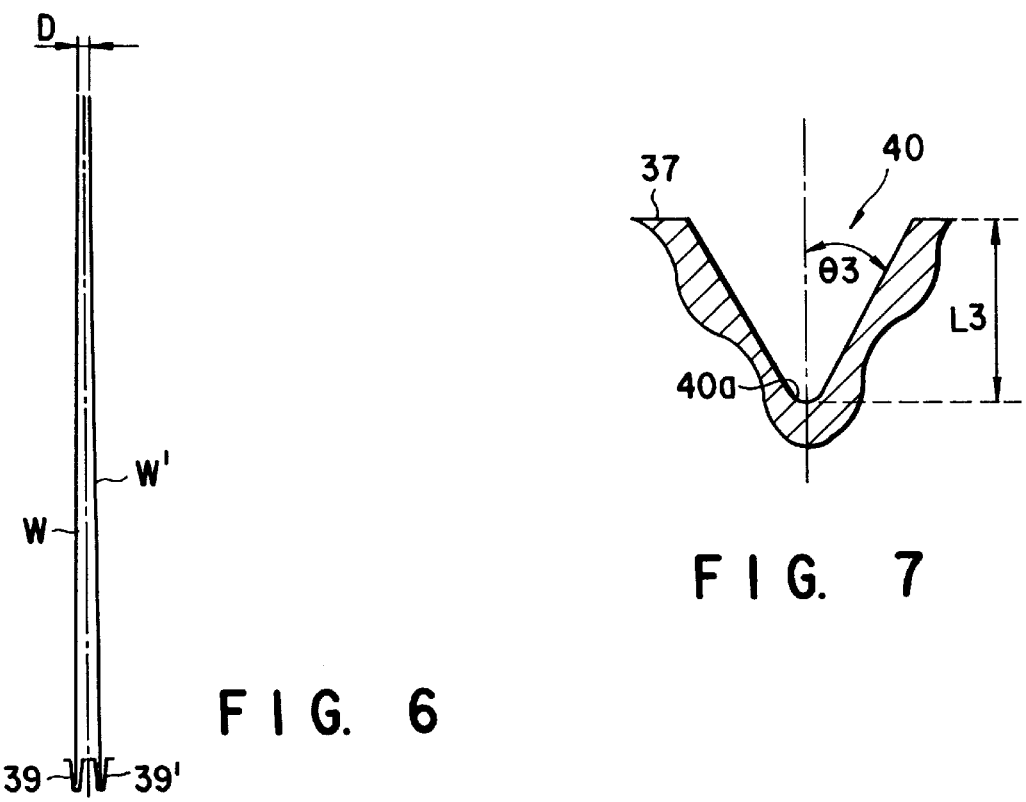
FIG. 6
FIG. 7
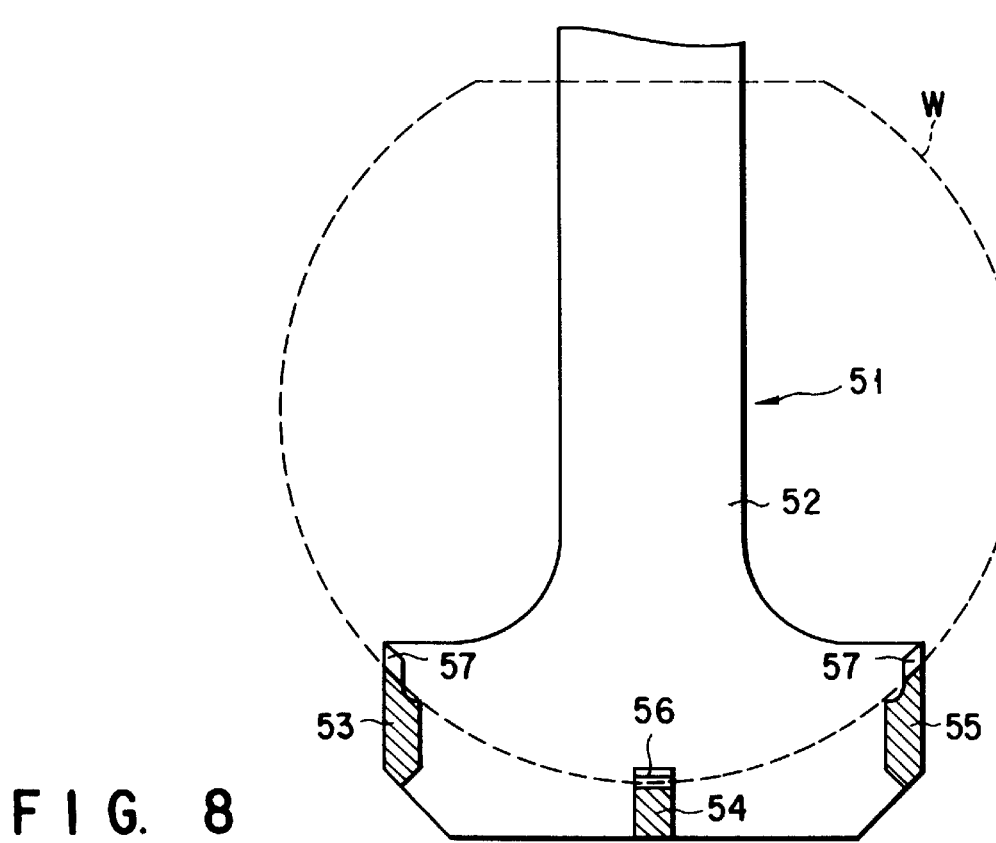
FIG. 8

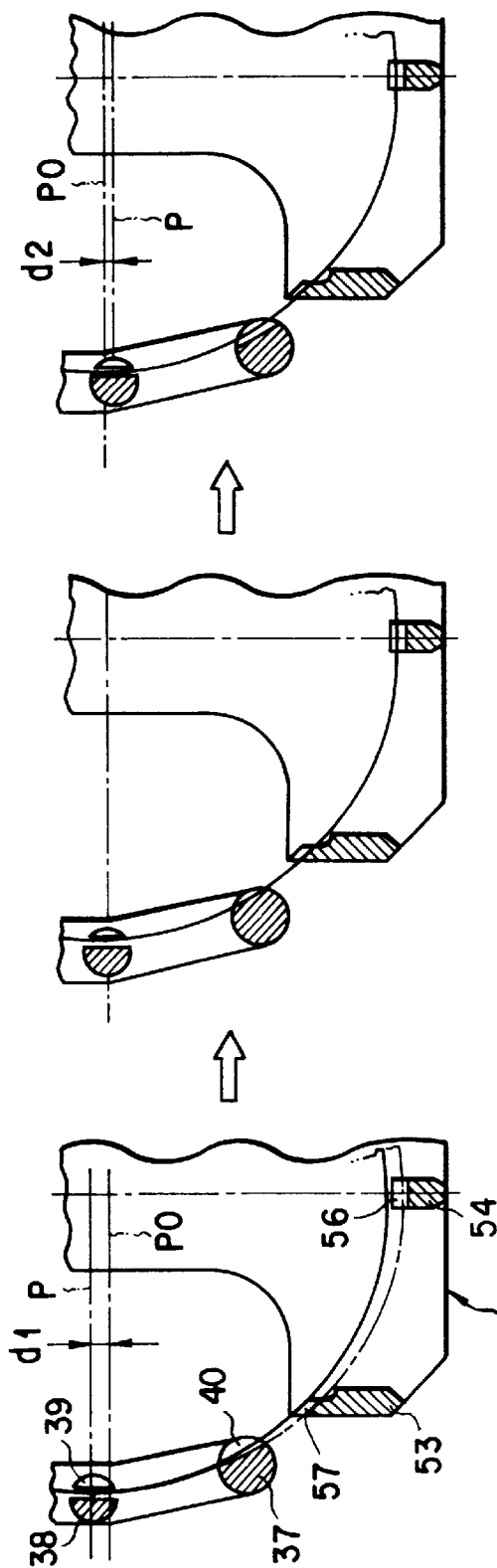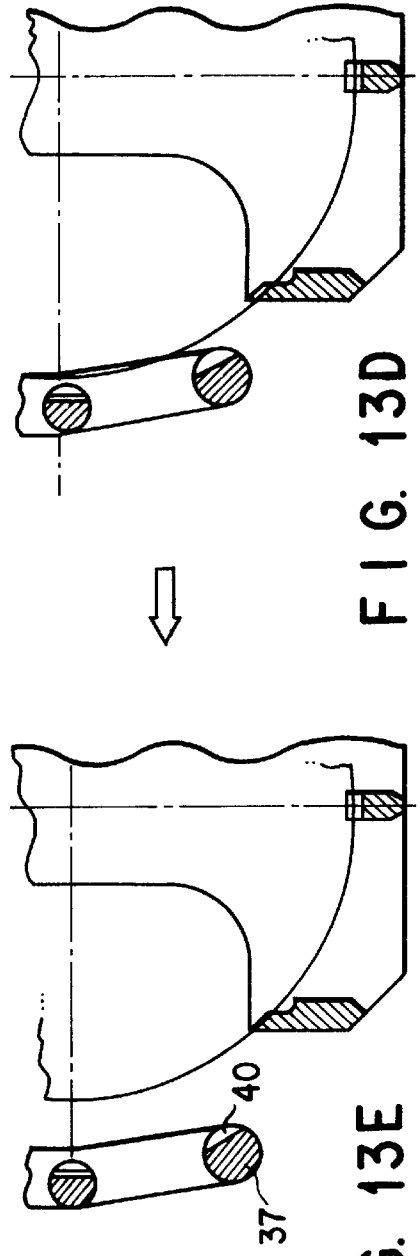

TRANSFER MACHINE, TRANSFER METHOD, CLEANING MACHINE, AND CLEANING METHOD

BACKGROUND OF THE INVENTION

1. Field of the Invention

The present invention relates to a transfer machine, a transfer method, a cleaning machine, and a cleaning method.

2. Description of the Related Art

In a cleaning process of the manufacture steps of a semiconductor device such as LSI, a cleaning machine has been conventionally used to remove contaminations such as particles formed on a semiconductor wafer (hereinafter called "wafer"), organic contaminations, and metallic impurities. Particularly, a wet type cleaning machine has been widely used since particles can be effectively removed and a batch process can be carried out.

The above-typed cleaning machine comprises a loader, a transfer machine, a plurality of processing chambers, and an unloader. The loader loads a wafer cassette, which contains a predetermined number of wafers, for example, 25 wafers. The transfer machine picks up a predetermined number of wafers from the wafer cassette loaded by the loader, for example, 50 by 50 wafers to be transferred. The process chambers are arranged to clean the wafers, which are transferred by the transfer machine, as a group.

The transfer machine has a holding unit, which is called a wafer chuck, to hold the predetermined number of wafers, e.g., 50 wafers in the group at the same time when transferring the wafers to each of the process chambers. The holding unit has a pair of holding members disposed to be opposite to each other. Each of the holding members has upper and lower holders disposed parallel to each other. Holding notches are formed in each of the holding members. These holding notches hold the peripheral edges of the wafers, and the holding notches of the lower holder support a load of each of processing objects so as to hold the wafers. The holding notches of the upper holder prevents the tilt of each of the wafers, and maintains an array state of adjacent wafers such that a predetermined distance between the adjacent wafers is maintained.

In this case, even where the peripheral edges have no pattern thereon, an area of the peripheral edge of each of the wafers, which comes in contact with the holding notches, must be formed as small as possible in order to prevent generation of particles and damage, which is exerted on the wafer itself. Moreover, for holding the wafer peripheral edges by the holders, the larger the width of the notches becomes, the more smoothly the wafer can be inserted to the notches. Moreover, a jump throttle can be prevented. In consideration of these points, conventionally, the cross sectional shape of each of the holding notches of the respective upper and lower holders (cross sectional shape of an inner wall of each of the notches) was substantially V-shaped.

On the other hand, in each of the process chambers where the wafers are cleaned, a holding unit, which is called a boat, to hold the wafers to be transferred by the transfer machine. In order to receive the wafers, which are held by the holding unit, as a group, to be held, a plurality of holding notches corresponding to the holding notches of the holding unit is formed in the holding unit. Then, peripheral edges of the respective wafers are vertically received into these holding notches such that each of the wafers can be held at a predetermined holding position. Similar to the above-mentioned case of the holders, the cross sectional shape of each of the holding notches was formed to be V-shaped.

However, if the cross sectional shape of each of the holding notches is V-shaped, the range in which each of the wafers rotates around a notch bottom in its surface direction is largely expanded. In other words, the so-called "play" is increased. As a result, there is a possibility that the adjacent wafers will be brought into contact with each other, and that particles will be generated, or the wafers will be damaged. Also, if the distance between the adjacent wafers is extremely short even in a state that the contact therebetween is not established, drops of cleaning liquid are trapped between the adjacent wafers due to the action of surface tension upon lifting the arranged wafers as they are pulled from the process chamber by the wafer chuck. As a result, there is a case that an unfavorable influence is exerted on the later processing.

Moreover, for example, in the process chamber in which the wafers are cleaned with a high temperature chemical solution, there is a case in which boiling of chemical solution is performed in a state that each of the wafers is dipped in the cleaning liquid. Also, there is a case in which bubbling of $N_2$ gas is performed in a cleaning liquid in order to clean the wafers and the wafer chuck. However, if the depth of the holding notches, which support the wafers, is not sufficiently formed, there is a possibility that the so-called jump throttle will be generated. In other words, the wafer is moved by the force of the cleaning liquid or the force of bubbling of $N_2$ at the time of cleaning, and the peripheral edge of each of the wafers is detached from the holding notches.

SUMMARY OF THE INVENTION

An object of the present invention is to provide a transfer machine, which can improve shapes of holding notches of a holding unit for transferring to-be-processed objects (i,e., objects which will subsequently be processed) such as wafers and those of a holding unit of a process bath, so that a width of the each of holding notches can be increased, and contact between the to-be-processed objects can be reduced, and a distance between the adjacent to-be-processed objects in an array state can be restricted to a suitable range.

Also, another object of the present invention is to provide a new transfer method of transferring to-be-processed objects so that little damage is exerted on the to-be-processed objects in transferring the to-be-processed objects between a transfer machine and a holding unit, utilizing the above-improved shapes of the holding notches.

Moreover, another object of the present invention is to provide a cleaning machine and a cleaning method utilizing the above-motioned transfer machine and transfer method so as to realize a cleaning process having no jump throttle, a high yield, and a good throughput.

According to the present invention, there is provided a transfer machine comprising: a pair of holding members provided to be opposite to each other to hold a plurality of to-be-processed objects arranged with a predetermined distance at their peripheral edges; a drive mechanism for selectively driving the holding members toward and away from each other in order to selectively hold and release of the to-be-processed objects; and a transfer mechanism for transferring the to-be-processed objects and the holding members to a bath in a state in which groups of the to-be-processed objects are supported in order to processing in the bath. Each of the holding members has upper and lower holders arranged to be parallel to each other, and each has a plurality of holding notches for holding the peripheral edges of the to-be-processed objects. The holding notches of the upper holder each has a first taper part positioned at an opening side and a second taper part positioned at a notch bottom side and continuing the first taper part, and the first taper part has an opening angle larger than an opening angle of the second taper part.

According to the present invention, there is also provided a transfer method in which a plurality of plate-like to-be-processed objects are held by a pair of holding members each having a first holding element and a second holding element, with the first holding element having a plurality of holding notches for supporting loads of the plurality of plate-shape to-be-processed objects and the second holding element having a plurality of holding notches, which each having a first taper part and a second taper part continuing the first taper part, and with the first taper part positioned at an opening side to maintain an arrangement of the to-be-processed objects. The second taper part is positioned at a notch bottom and has an opening angle smaller than the first taper part for holding the peripheral edges of the to-be-processed objects; are moved down to-be-processed objects held by the holding members are move down a first predetermined position of a bath from an initial position at first predetermined speed so that the to-be-processed objects are processed in the bath; and the to-be-processed objects to are then moved down transfer them to a second predetermined position from the first predetermined position at second predetermined speed slower than the first predetermined position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 6 is a view showing a state that a top end of the wafer held in the adjacent holding notches of FIG. 4 approaches most;

FIG. 7 is a cross sectional view of a V-shaped holding notch formed in a lower holder of the holding members of FIG. 3;

FIG. 8 is a front view of a boat provided in a chemical solution bath of FIG. 2;

FIGS. 13A to FIG. 13E are views each showing a state of the wafer in a process for mounting the wafer held by the wafer chuck of the transfer machine of FIG. 2 on the holding portion of the boat of the chemical solution bath;

DETAILED DESCRIPTION OF THE PREFERRED EMBODIMENTS

The following will explain an example in which the present invention is applied to a cleaning machine for a semiconductor wafer (hereinafter called "wafer").

Figure 1:
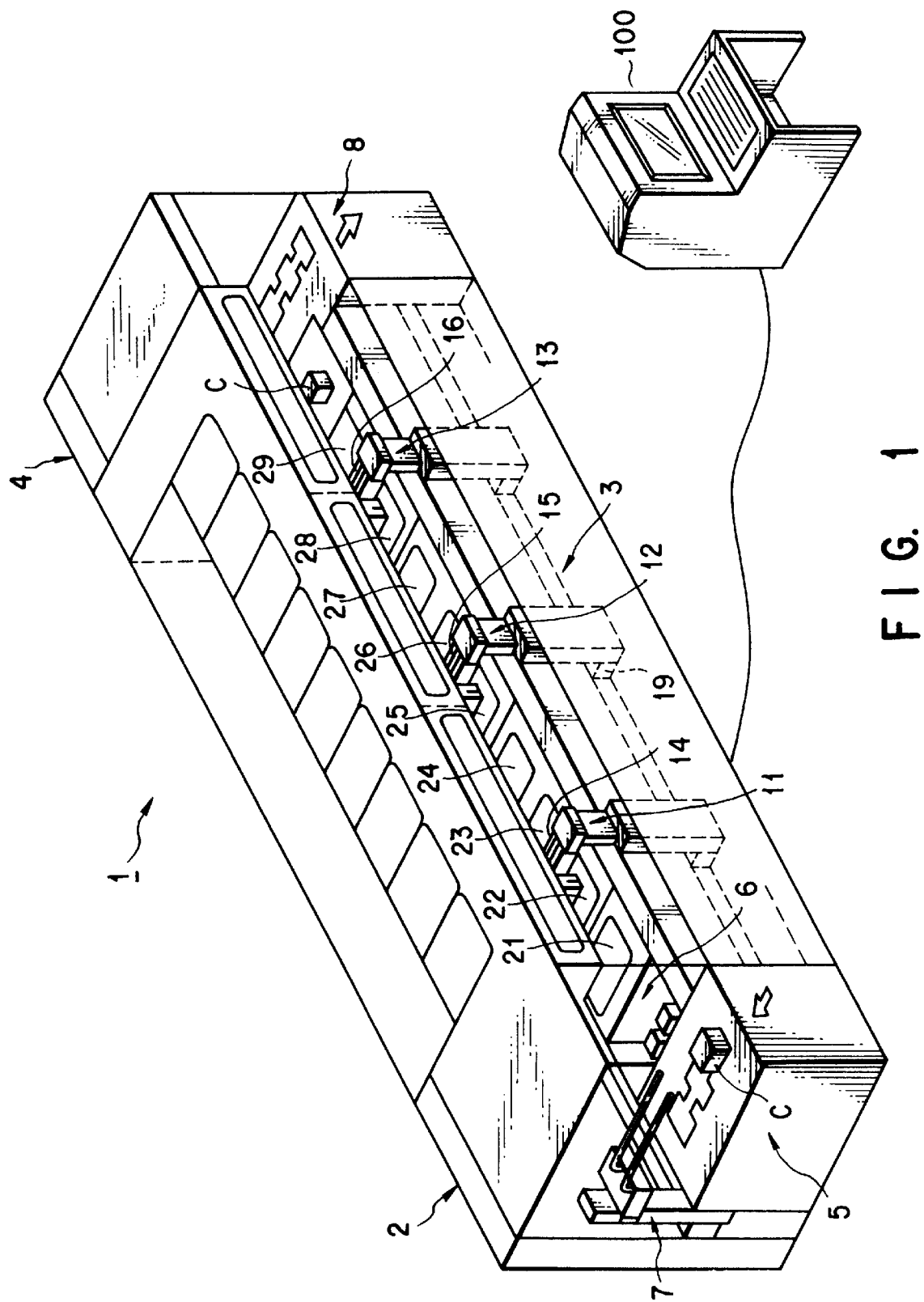
FIG. 1 is a perspective view of a cleaning machine of an embodiment of the present invention.

As shown in FIG. 1, a cleaning machine 1 comprises three sections, that is, a loader section 2 for loading to-be-processed wafers in units of carriers, a cleaning section (cleaning machine) 3 by which the wafer is subjected to a cleaning process, and an unloader section 4 for unloading the processed wafers in units of carriers.

In the loader section 2, there are provided a platform 5, and a conveyer machine 7. A carrier C, which contains a predetermined number of to-be-processed wafers, for example, 25 wafers, is loaded and mounted on the platform 5. The conveyer machine 7 conveys the mounted carrier C to an alignment section 6. In the cleaning section 3, three transfer machines 11, 12, and 13 are arranged at a front side of the cleaning section 3. Also, wafer chucks 14, 15 and 16, which correspond to the transfer machines 11, 12, and 13, respectively, are provided. The wafer chuck 14 of the transfer machine 11 is structured to hold the wafers (50 wafers), which correspond to the number of wafers of two carriers, from the alignment section 6 so as to be transferred to a cleaning bath (to be described later).

Moreover, in the unloader section 4, there are provided a platform 8, which has substantially the same structure as the platform 5, an alignment section (not shown), which has substantially the same structure as the alignment section 6, and a transfer machine (not shown), which has substantially the same structure as the transfer machine 7.

In the cleaning section 3, there are arranged a chuck cleaning/drying bath 21, a chemical solution bath 22, water baths 23 and 24, a chemical solution bath 25, water baths 26 and 27, a chuck cleaning/drying bath 28, and a drying bath 29 in order from the side of the platform 5. The chuck cleaning/drying bath 21 is used to clean and dry the wafer chuck 14 of the transfer machine 11. The chemical solution bath 22 is used to clear the wafers of organic contaminations, metallic impurities, and impurity materials such as particles utilizing a chemical solution. The water baths 23 and 24 are used to clean the wafers cleaned in the bath 22 with, for example, pure water. The chemical solution bath 25 is used to clean the wafer with a chemical solution, which is different from the chemical solution used in the bath 22. The water baths 26 and 27 are used to clean the wafer cleaned in the bath 25 with, for example, pure water. The chuck cleaning/drying bath 28 is used to clean and dry the wafer chuck 16 of the transfer machine 13. The drying bath 29 is used to steam-dry the wafer from which impurity materials are removed with, for example, IPA (isopropyl alcohol). In the baths 22 to 27, there is a case in which these baths are structured such that bubbling of $N_2$ gas is performed from the bottom portion of each of the baths in order to improve a cleaning effect. In particular the chemical solution baths 22 and 25 are structured such that chemical solution can be boiled in a state in which the wafer is dipped in the cleaning liquid.

Figure 2:
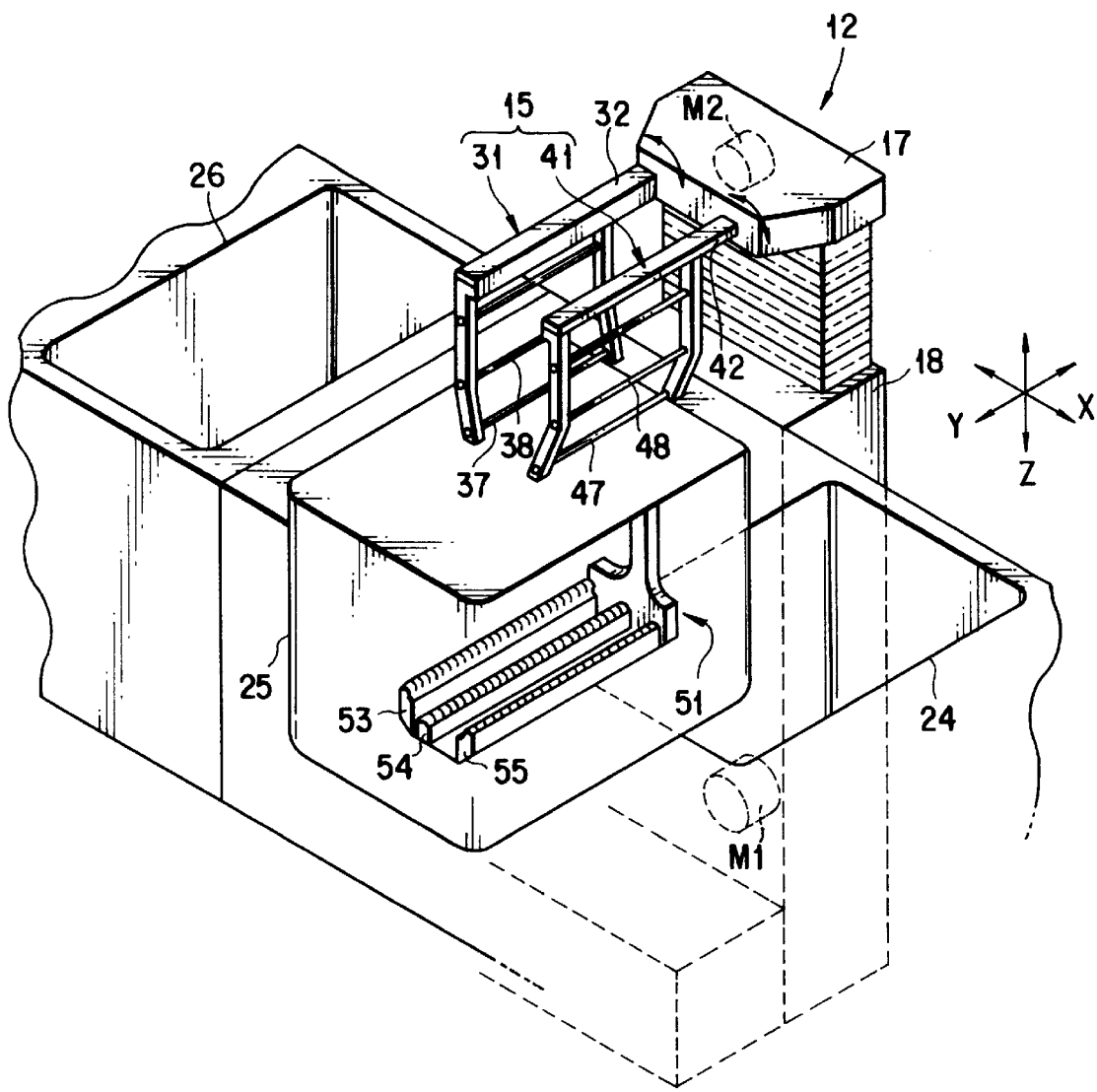
FIG. 2 is a perspective view of a transfer machine of the cleaning machine of FIG. 1.
Figure 3:
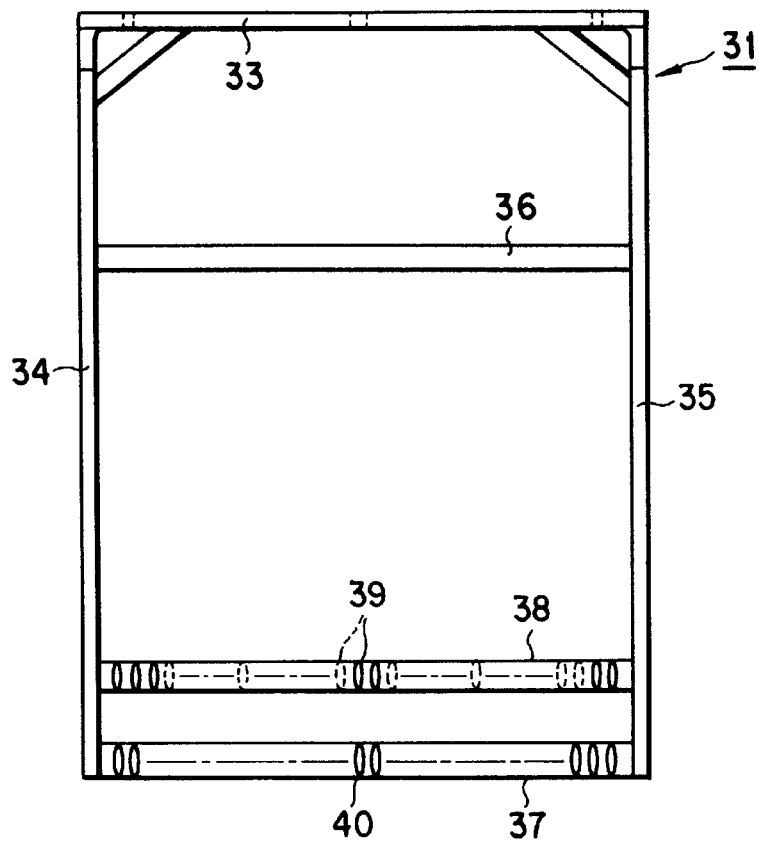
FIG. 3 is a front view of a holding member of the transfer machine of FIG. 2.

FIG. 2 explains the transfer machine 12, which is structured to transfer the wafers between the adjacent baths 24, 25, and 26. A wafer chuck 15 of the transfer machine 12 comprises a pair of right and left holding members 31 and 41, which are used to hold, e.g., 500 wafers W in a group.

The right and left holding members 31 and 41 are symmetrically formed. Moreover, the holding members 31 and 41 are supported by corresponding rotating shafts 32 and 42, respectively. These rotating shafts 32 and 42 are supported by a supporting member 17 of the transfer machine 12. The supporting member 17 is moved to upper and lower directions (direction Z) by a driving mechanism 18 including a stepping motor M1. The wafer chuck 15 itself is built in the supporting member 17. The wafer chuck 15 is structured to be freely movable to backward and forward directions (direction Y) by a driving mechanism including a stepping motor M2. The driving mechanism 18 itself is formed on an upper portion of a transferring base 19 (shown in FIG. 1), which is freely movable along a longitudinal direction (direction X) of the cleaning section 3.

The rotating shafts 32 and 42 are structured to be freely rotatable in a reciprocating manner as shown in arrows of FIG. 2 by the driving member such as the stepping motor M2 of the supporting member 17. Moreover, the supporting member 17 itself can be slightly adjusted to a direction θ.

The paired right and left holding members 31 and 41, which structure the wafer chuck 15, are symmetrically formed. For example, the holding member 31 comprises a frame 33 fixed to the rotating shaft 32, stays 34 and 35, which vertically extend from back end portions of the frame 33, a reinforcing bar 36, a lower holding bar 37, which is substantially bar-shaped, and an upper holding bar 38, which is substantially bar-shaped. The reinforcing bar 36 is extend before a stretched to substantially upper portions of the stays 34 and 35. The lower holding bar 37 extends between lower ends of the stays 34 and 35. The upper holding bar 38 extends parallel to the upper portion of the lower holding bar 37. The stays 34 and 35 are inclined to the inside at the lower end portions.

Figure 4:
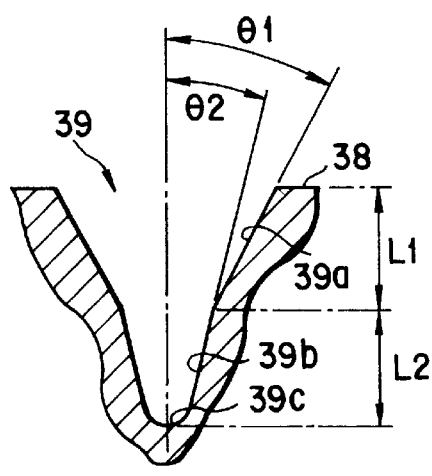
FIG. 4 is a cross sectional view of a two-stage tapered holding notch formed in an upper holder of the holding members of FIG. 3.

Holding notches 39 shown in FIG. 4 are formed on the surface of the upper holding bar 38 which faces toward an opposing holding member 41 with a predetermined depth. For example, in supporting 8-inch wafers, 50 wafers are disposed thereon with a notch depth of 6.35 mm. The cross sectional shape of the notches 39 is formed to be two-stage tapered. The notches 39 are formed of a first tapered part 39a positioned at an opening side and a second tapered part 39b positioned at a notch bottom 39b. An opening angle of the first taper part 39a is 50° to 70°.

For example, in supporting 8-inch wafers, the opening angle is 60°±4°. In other words, an opening angle θ1 from a line bisecting the notch to a notch side wall adjacent to the opening of one side around the notch bottom 39 is set to 30°±2°. Also, an opening angle of the second taper part 39b is 20° to 40°. For example, in supporting 8-inch wafers, the opening angle is 30°±4°. In other words, an opening angle θ2 from the line bisecting the notch to the notch side wall adjacent to of one side around the notch bottom 39c is set to 15°±2°.

In the above embodiment, the cross section of the notch bottom 39c is formed to be arcuate. Moreover, a radius of curvature of the notch bottom 39c is set to 0.3 to 0.8 mm, for example, 0.5 mm ±0.2 mm. Moreover, regarding the depth of the holding notch 39, as shown in FIG. 4, depth L1 of the first taper part 39a is set to 3 mm, depth L2 of the second taper part 39a is also set to 3 mm, and the total depth of the holding notches is 6 mm. The depth L1 of the first taper part 39a and the depth L2 of the second taper part 39b can be arbitrarily set in the suitable range to meet the size of the wafer.

Figure 5:
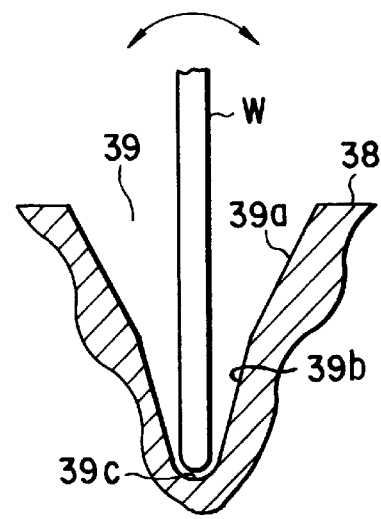
FIG. 5 is a view showing a state that a peripheral edge of a wafer is held in the holding notch of FIG. 4.

In the above-set holding notches 39, for example, if wafer W is held in the holding notch 39 such that the gap between the peripheral edge of 8-inch wafer W and the notch bottom 39c of the holding notch 39 is set to about 1 mm as shown in FIG. 5, the right and left rotations of wafer W is restricted by the second taper part 39b. However, as mentioned above, in this embodiment, the opening angle of the second taper part 39b is set to 28°. Due to this, as shown in FIG. 6, the closest distance D between the wafer W and the other wafer W' held by the other adjacent holding notches 39' is 2 mm. The closest distance D can be arbitrarily selected in the range of 1 to 3 mm in accordance with the distance between the holding notches 39 and the opening angle θ1 of one side around the notch bottom 39c.

Moreover, on the surface of the lower holding bar 37, there are formed holding notches 40 whose pitch and number are the same as the holding notches 39 in order to directly receive the load of wafer W to be held. As shown in FIG. 7, the cross section of the holding notches 40 is V-shaped, and the opening angle is 50° to 70°. In other words, opening angle θ3 of one side around the notch bottom 40a is set to 25° to 35°. Also, depth L2 of the holding notches 40 is set to 4 mm, and a radius of curvature of the notch bottom 40a is set to 0.3 to 0.8 mm.

The other holding member 41, which is opposite to the above-structured holding member 31, has an upper holding bar 48 in which the holding notches 39 are formed and a lower holding bar 47 in which the holding notches 40 are formed. The holding members 31 and 41 are opened/closed by the rotating shafts 32 and 42, respectively. The lower peripheral edge of wafer W is held by the opposing lower holding bars 37 and 47, thereby supporting the load of wafer W. As the same time, the side peripheral edge of wafer W is held by the opposing upper holding bars 38 and 48, thereby preventing the tilt of wafer W.

More specifically, if the load of the wafer is supported at the peripheral edge of wafer W by the lower holding bar 37 and the holding notches 40 of the lower holding bar 47, the other peripheral edge portion of the wafer W is inserted to the second taper part 39b in the upper holding bar 38 and the holding notches 39, so that the peripheral edge of wafer W is supported. In other words, if the other peripheral edge portion of wafer W is not yet inserted to the second taper part 39b, the peripheral edge portion of wafer W is not supported by the lower holding bar 37 and the holding notches 40 of the lower holding bar 47.

The other transfer machines 11 and 13 and their wafer chucks 14 and 16 have the same structure as the transfer machine 12 and its wafer chuck 15.

In an inner bottom portion of each of the respective cleaning baths, there is provided a boat 51, serving as a holding unit for holding wafer W in the bath as shown in FIG. 51. The boat 51 has a support member 52. Then, holding sections 53, 54 and 55, which are supported by the support member 52, are provided at the lower portion of the support member 52.

Figure 9:
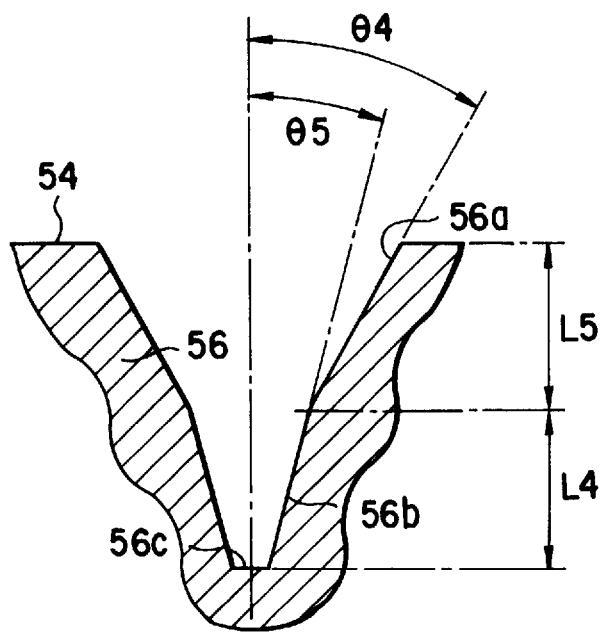
FIG. 9 is a cross sectional view of a two-stage tapered holding notch formed in a holding portion at a center of the boat of FIG. 8.

On the surface of the holding section 54, which is positioned at the center of these holding sections 53, 54 and 55, there are formed 50 holding notches 56 having the same pitch as the holding notches 39 of the upper holding bar 38. These holding notches 56 are formed to prevent the tilt of wafers W. As shown in FIG. 9, the cross sectional shape of each of the notches 56 is formed to be two-stage tapered. Each of the notches 56 is formed of an upper tapered part 56a positioned at an opening side and a lower tapered part 56b positioned at a notch bottom 56c. An opening angle of the upper taper 56a is 50° to 70°. In other words, opening angle θ4 of one side around the notch bottom 56c is set to 25° to 35°. Then, an opening angle of the lower taper 56b is 10° to 20°. In other words, opening angle θ5 of one side around the notch bottom 56c is set to 5° to 10°.

Regarding the depth of each of these holding notches 56, as shown in FIG. 9, depth L5 of the upper taper part 56a is set to 3 mm, depth L6 of the lower taper part 56b is also set to 3 mm, and the total depth of the holding notches 56 is set to 6 mm. Similar to the case of the holding notches 39 of the upper holding bar 38 of the wafer chuck 15, the closest distance D between the adjacent top end portions of the held wafers W is 2 mm.

Figure 10:
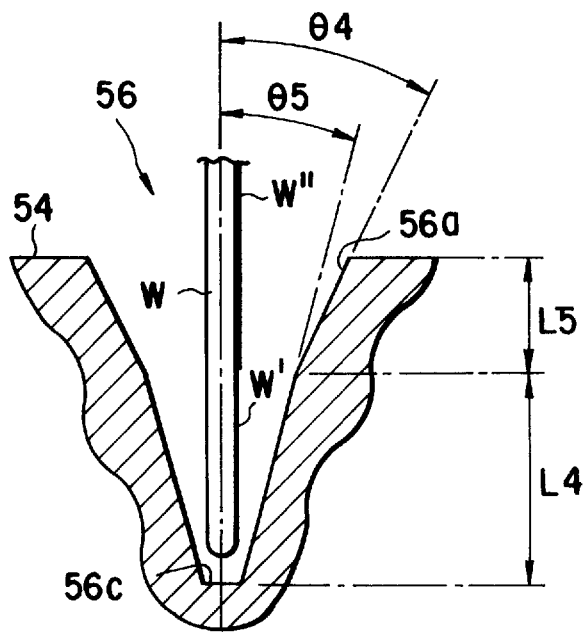
FIG. 10 is a cross sectional view of a two-stage tapered holding notch formed in the holding portion where a lower tapered portion of the holding notch is deeply formed.

It is of course possible to suitably change depth L5 of the upper taper part 56a and depth L4 of the lower taper part 56b. In an example shown in FIG. 10, a ratio of depth L5 of the upper taper part 56a to depth L4 of the lower taper part 56b is set to 3:5. In this case, similar to the example of FIG. 9, the opening angle of the upper taper 56a is 50° to 70°. In other words, opening angle θ4 of one side is set to 25° to 35°. Then, the opening angle of the lower taper 56b is 10° to 20°. In other words, opening angle θ5 of one side is set to 5° to 10°.

Figure 11:
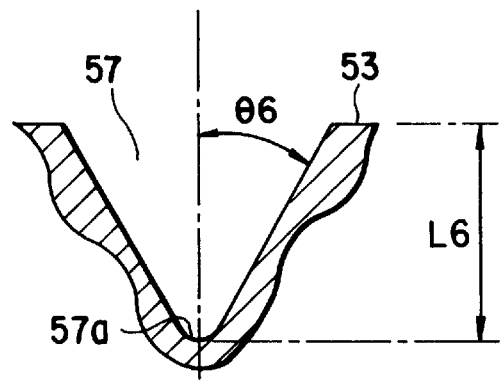
FIG. 11 is a cross sectional view of a V-shaped holding notch formed in the lower holders of both sides of the boats of FIG. 8.

Among the holding sections 53, 54 and 55, the holding sections 53 and 55, which are positioned at both sides of the holding section 54, are formed to be symmetrical right and left. On the surface of each of the holding sections 53 and 55, there are formed 50 holding notches 57 having the same pitch as the holding notches 56. These holding notches 57 are formed to directly support the load of wafer W. As shown in FIG. 11, the cross section of the holding notches 57 is V-shaped, and the opening angle is 60°. In other words, opening angle θ6 of one side around the notch bottom 57a is set to 30°. Also, depth L6 of each of the holding notches 57 is set to 4 mm, and a radius of curvature of the notch bottom 40a is set to 0.4 mm. It is possible to set opening angle θ6 to 10° to 20°. Also, the depth L6 can be set to a suitable value between 3 to 10 mm, for example, 4 mm.

If the load of wafer W is supported at peripheral edge portions of wafer W by the holding notches 57 of each of the holding sections 53 and 55, the other peripheral edge of portion wafer W is inserted into the lower taper part 56b in the holding notches 56 of the holding section 54, so that the peripheral edge of wafer W is supported. In other words, if the other peripheral edge portion of wafer W is not yet inserted to the lower taper part 56b, the peripheral edge of wafer W is not supported by the holding notches 57 of each of the holding sections 53 and 55.

Next, the following will explain one example of a cleaning process of wafers W using the above-structured cleaning machine 1.

For example, if the carrier C, which contains to-be-processed wafers, is mounted on the loader section 2 by a transfer robot (not shown), the carrier C is conveyed to the alignment section 6 after an orientation flat alignment operation is completed. Then, only wafers W are lifted up from the carrier C by a lifting-up unit (not shown), which is mounted on the alignment section 6. Thereafter, wafers W are held as a group by the wafer chuck 14 of the transfer machine 11, and dipped in the chemical solution bath 22 and the water bath 23 in order. Then, wafers W of the water bath 23 are held as a group by the wafer chuck 15 of the transfer machine 11, and dipped in the water bath 24, the chemical solution bath 25, and the water bath 26 in order. Sequentially, wafers W held by the wafer chuck 15 are dipped in the water bath 27, the chemical solution bath 28, and the water bath 29 in order. Thereby, a predetermined cleaning process is provided to wafers W.

In dipping wafers W in each of baths, wafers W held by the wafer chuck are mounted on the boat, which is formed on each of the baths. For example, based on the process in which wafers W held by the wafer chuck 15 are conveyed and mounted on the boat 51 provided in the chemical solution bath 25, the following will be explained.

Figure 12:
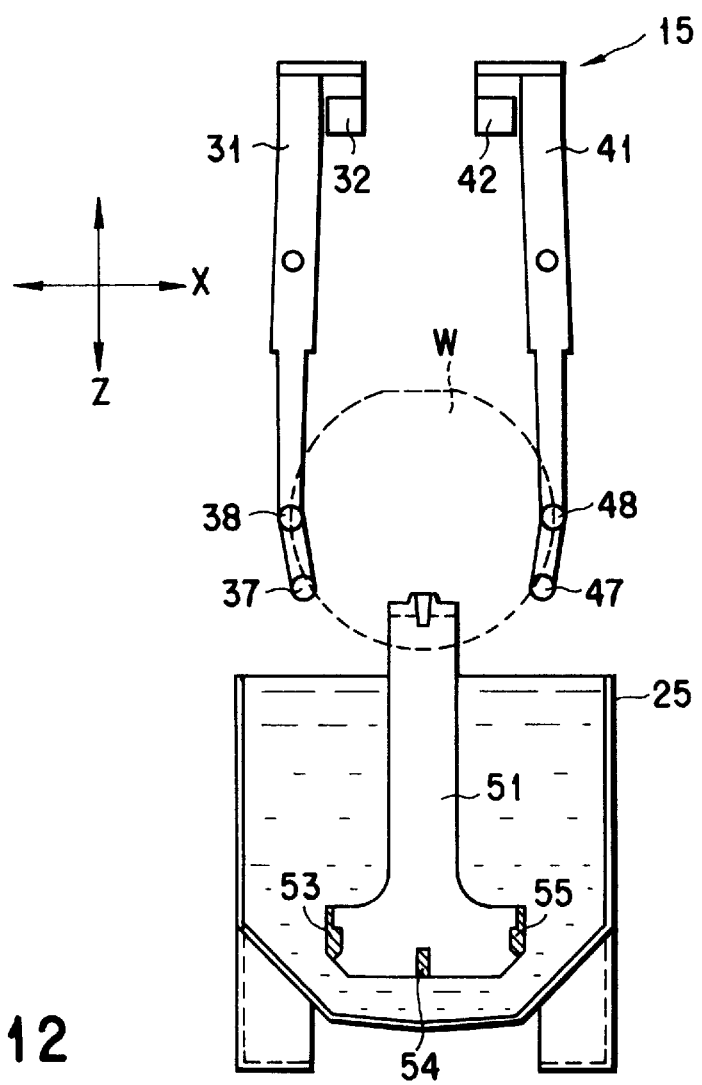
FIG. 12 is a view showing a state that the wafer is held at an upper portion of the chemical solution bath by a wafer chuck of the transfer machine of FIG. 2.
Figure 14:
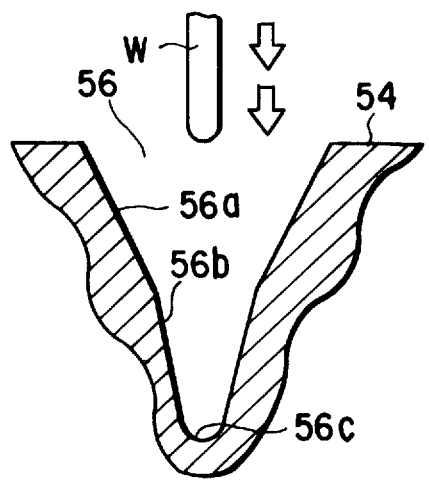
FIG. 14 is a cross sectional view of a notch when a lower peripheral edge of the wafer is not yet inserted to an upper taper portion of the holding notch in the process of FIGS. 13.

As shown in FIG. 12, the wafer chuck 15 is first moved up to an upper portion of a predetermined position of the chemical solution bath 25 along a direction X, and then moved down along a direction Z. In this case, a moving (descending) speed of the wafer chuck 15 is set to be relatively high (e.g., maximum 400 mm/sec).

Once the lower end portion, which holds each of wafers W, is started to be dipped in the chemical solution of the bath 25, the moving speed is reduced to a relatively intermediate value (e.g., 300 mm/sec), so that the wafer chuck 15 descends to a predetermined stop point together with the wafers (the above-mentioned intermediate value (speed) is relatively higher than the moving speed of the wafer chuck 15 after the lower peripheral edge of wafer W enters the lower taper part 56b to be described later). A stop timing of the wafer chuck 15 may be set based on a difference d1 between a center P of the held wafer W and a center P0 of wafer W held by the boat 51 as shown in FIG. 13A.

Figure 15:
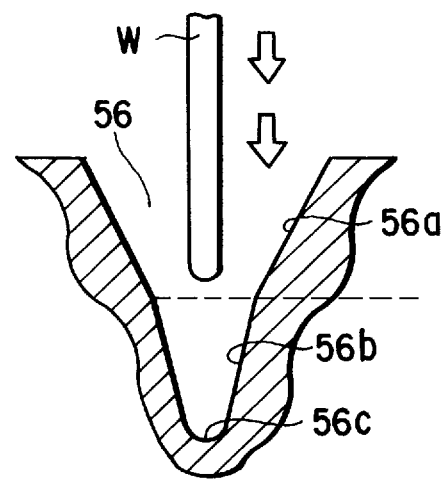
FIG. 15 is a view explaining a cross section of a main part showing a state just before the lower peripheral edge of the wafer is inserted to a lower taper portion of the holding notch in the processes of FIGS. 13A to 13E.
Figure 16:
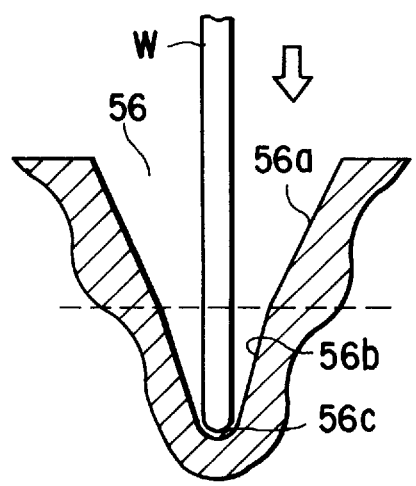
FIG. 16 is a view showing a state that the lower peripheral edge of the wafer is inserted to the lower taper portion of the holding notch in the processes of FIGS. 13A to 13E.

In the above embodiment, the intermediate descending speed of the wafer chuck is maintained during the time when the lower peripheral edge of wafer W is positioned at the upper taper portion 56a of each of the holding notches 56 of the holding section 54. Moreover, the intermediate descending speed of the wafer chuck is maintained until the lower peripheral edge of wafer W enters the lower taper part 56b as shown in FIG. 15. Thereafter, the wafer chuck further descends. Then, the descending speed of the wafer chuck is changed to be relatively low (about 2 mm/sec) at the time when the lower peripheral edge of wafer W enters the lower taper part 56b. Thereafter, the wafer chuck descends at the relatively low speed at least until the load of each of wafers W is supported by the holding notches 57 of the holding sections 53 and 55 as shown in FIGS. 13B and 16. The moving speed of the wafer chuck may be set as follows.

More specifically, the descending speed of the wafer chuck is set to be relatively intermediate or high until the lower peripheral edge of wafer W enters the lower taper part 56b. Then, the descending speed of the wafer chuck is set to be relatively low until the load of each of wafers W is supported by the holding notches 57 as shown in FIG. 16 after the lower peripheral edge enters the lower taper part 56b.

In the above-mentioned embodiment, wafers W are set to descend after wafers W of FIG. 13B are held by the holding sections 53, 54 and 55. Then, the descending speed of the wafer chuck is set to be moved at a relatively low speed down to a position, which is 3 mm lower than center Po of wafer W placed when wafers W are supported by the holding sections 53 and 54, that is, center P of wafer W placed when wafers W are held by the wafer chuck 15 (d2 in FIG. 13C).

As shown in FIG. 13B, it can be considered that the lower peripheral edge of a wafer will, at worst, come in contact with the notch bottom 56c of each of the holding notches 56 manufacturing variations in the accuracy of holding notches. However, the radius of curvature of the peripheral edge of this kind of 8-inch wafer is 0.3 mm. In contrast, according to the embodiment of the present invention, the width of the notch bottom 56c of each of the holding notches 56 is formed to be larger than this value. Due to this, even if the lower peripheral edge of such a wafer W comes in contact with the notch bottom 56c of each of the holding notches 56, an area of such a contacting portion is considerably small, and generation of particles due to contact is extremely restricted. Moreover, damage from the contact the wafer W itself is minimal.

Figure 17:
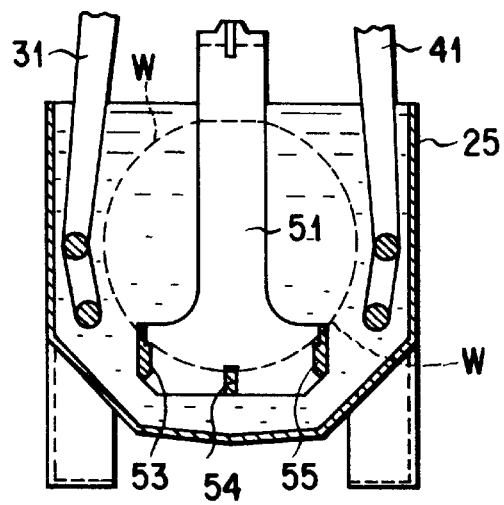
FIG. 17 is a view showing a state just before the wafer chuck is lifted after the wafer is held in the processes of FIGS. 13A to 13E.

After the holding member of the wafer chuck 15 descends to the descending point, the rotating shafts 32 and 42 are rotated by the step motor M2, so that the holding members 31 and 41 are opened to the position where the holding notches 40 of the holding bars 37 and 47 do not contact the peripheral edges of wafers W as shown in FIGS. 13D, 13E and 17. At this time, the rotation speed of the rotating shafts 32 and 42, that is, the opening speed which is needed when the holding members 31 and 41 are opened, may be set to be relatively low from the state of FIG. 13C to that of FIG. 13D, and relatively high from the state of FIG. 13D to that of FIG. 13E. After the state of FIG. 13E, the chuck wafer 15 rises along a direction Z in a state that the opening angle between the holding members 31 and 41 is maintained. Then, the holding members 31 and 41 are lifted up from the chemical solution bath 25.

The wafers W held by the boat 51 of the chemical solution bath 25 are cleaned with predetermined chemical solution. In the chemical solution bath 25, there is a case that boiling of the chemical solution or bubbling of $N_2$ gas is performed in a state that wafers W are dipped in the solution in order to improve the cleaning efficiency. Since the closest distance between the top ends of the adjacent wafers W held by the boat 51, however, is suitably set by the lower taper part 56b of the holding notches 56 of the holding section 54, even if wafers W are oscillated by the flow of boiled chemical solution or force of bubbling gas during the cleaning process, the wafers W to do not contact each other. Due to this, the generation of particles, which is caused by contacting wafers W each other during the cleaning process, can be prevented, and damage of wafers W can be also prevented.

Moreover, the opening angle of the lower taper part 56b of each of the holding notches 56 is smaller than that of the upper taper part 56a. Thereby, it is possible to effectively prevent the generation of the so-called jump throttle in which the peripheral edge of each of wafers W is detached from each of the holding notches 56 and 57 if wafers W are moved by force of the boiled cleaning solution or force of bubbling of $N_2$. Particularly, in the example shown in FIG. 10, since the lower taper part 56b is deeply formed, wafers W are not easily detached from the holding notches 56, and the generation of such a jump throttle can be more effectively prevented.

The problem of the jump throttle of wafers W can be solved by deepening the lower taper part 56b of each of the holding notches 56 of the holding section 54. However, if the lower taper part 56b is formed too deeply, a portion W", which extends over an edge cut portion W' of each of wafers W, is unfavorably inserted to the lower taper part 56b. In this case, the portion W' is a portion of the peripheral edge of the wafer W on which no device is fabricated, and the portion W" is a portion of the wafer W on which a device is fabricated. Moreover, if depth L5 of the upper taper part 56a is too short as compared with depth L4 of the lower taper part 56a, there causes a problem in that wafers W are not easily mounted on the holding notches 56. In order that the device forming portion W" of wafer W is not inserted to the lower taper part 56b, wafers W are smoothly mounted on the holding notches 56, and that the problem of the jump throttle is effectively solved, it is best that the ratio of depth L5 of the upper taper part 56a to depth L4 of the lower taper part 56b be set to 3:5.

After the end of cleaning, wafers W are lifted up from the chemical solution bath 25 to be transferred to the next water bath 26 through a process, which is completely reverse to the process when wafers W are transferred to the boat 51 to be mounted thereon. More specifically, the wafer chuck 15 descends at relatively high speed until the wafer chuck 15 enters the chemical solution bath 25. After wafers W are dipped in the chemical solution of the chemical solution bath 25, the descending speed of the wafer chuck 15 is changed to relatively intermediate speed. Thereafter, the wafer chuck 15 descends to the position shown in FIG. 13E at an intermediate speed, and stops. In the state shown in FIG. 13E, the rotating shafts 32 and 42 rotate at a relatively high speed, the holding members 31 and 41 are closed up to the position as shown in FIG. 13D at high speed.

The holding members 31 and 41 are moved (closed) at a relatively high speed until the side end peripheral edge of each of wafers W held by the boat 51 enters the second taper part 39b of each of the holding notches 39 of each of upper holding bars 37 and 48. After the side end peripheral edge enters the second taper 39b, which is positioned at the point of FIG. 13D, the closing speed of the holding members 31 and 41 is changed a relatively low speed, and the holding members 31 and 41 are closed at the changed speed for a while. In other words, the holding members 31 and 41 are closed at a relatively low speed from the state of FIGS. 13D to that of 13C. The descending of the wafer chuck 15 and the closing of the holding members 31 and 41 may be performed at the same time.

The closing of the holding members 31 and 41 is stopped at the point of FIG. 13C. Thereafter, the wafer chuck 15 rises. In this case, the rising speed of the wafer chuck 15 is set to be relatively low. At this time, as shown in FIG. 13B, each of wafers W is supported by the holding notches 40 of the lower holding bar 37 at the peripheral edge, and the peripheral edge of wafer W is inserted to the second taper part 39*b*. After wafers W are held by the holding members 31 and 41, the wafer chuck rises up to the point of FIG. 13A at a relatively low speed. Thereafter, the wafer chuck rises at a relatively intermediate speed while each of wafers W is dipped in the chemical solution of the chemical solution bath 25. Then, after wafers W are lifted up from the chemical solution bath 25, wafers W rise up to an initial position at a relatively high speed together with the wafer chuck. When wafer W reaches the upper initial position, wafer W is transferred to the next water bath 26.

As mentioned above, the speed of the movement of the holding members 31 and 41 of the wafer chuck 15, that is, the speed of each of the rising, descending, opening, and closing is suitably changed, wafers W can be conveyed and transferred rapidly without damaging the wafers W. In other words, the receiving of wafers W between the boat 51 and the wafer chuck 15 can be executed so that wafers W are not damaged and particles are not generated. Moreover, the wafer chuck 15 is moved at a relatively intermediate speed and a relatively high speed after receiving wafers W, so that wafers W can be transferred safely and rapidly.

In the above-mentioned embodiment, the following method is used.

More specifically, after the completion of receiving the wafers, the wafer chuck 15 is moved together with the wafers at a relatively intermediate speed while the chuck 15 is still dipped in the chemical solution of the chemical solution bath 25. Then, after the wafer chuck 15 is moved together with the wafers at the relatively intermediate speed, the wafer chuck 15 is moved together with the wafers at a high speed.

Therefore, the transfer speed can be suitably changed, thereby chemical solution can be prevented from being splashed on the wafers, and the cleaning machine 1 can be prevented from being contaminated.

Moreover, the holding notches 39 of each of upper holding bars 37 and 48 are formed to be two-stage tapered. In the case where the wafers are held by the second taper part 39*b*, the closest distance between the top end portions of the adjacent wafers W is set to the value ranging from 1 to 3 mm, for example, 2 mm. Due to this, even if chemical solution drops on the surface of each of wafers W, the drops of chemical solution do not stay between two adjacent wafers. Moreover, drops of chemical solution are not trapped between the adjacent wafers due to the action of surface tension. In other words, chemical solution directly drops downward. Due to this, wafers W are not contaminated, and no trouble occurs in the following processes.

As mentioned above, the distance between the adjacent wafers W held by the wafer chuck 15 is suitably set. Due to this, the adjacent wafers W do not contact each other when being transferred by the wafer chuck 15. Moreover, the particles are not generated on the wafers, and the wafers are not damaged.

The judgment on the change point of the speed can be easily performed by the following method.

More specifically, a pulse motor such as a step motor is used as a driving source to realize the movement of the wafer chuck 15 in the direction z and the rotation of the rotating shafts 32 and 42. Then, the speed is changed based on a predetermined reference number of pulses. In other words, an amount of movement of the wafer chuck 15 is measured by a pulse counter. Then, the speed of the pulse motor is set to be changed at the time when a predetermined number of pulses is accumulated. That is, a teaching work for obtaining teaching data such as number of accumulated pluses is performed when the chuck 15 or the boat 51 is replaced with new one. In this case, an operator provides a driving pulse to the step motor Ml for moving the wafer chuck in the direction z and the step motor M2 for rotating the rotating shafts 32 and 42 through a controller 100. Then, the operator records the following first to third number of pulses to the controller 100 as visually confirming the position of the wafer chuck. The first number of pulses are pulses, which are necessary to move the wafer chuck at high speed from the initial position to a position where the lower end of wafer W is started to be dipped in solution of the bath. The second number of pulses are pulses, which are necessary to move the wafer chuck at intermediate speed from a liquid surface position to a predetermined stop position. The third number of pulses are pulses, which are necessary to move the wafer chuck at low speed from the predetermined stop position to the position where the lower peripheral edge of wafer W enters the lower taper part. The initial position to a position where the lower end of wafer W is started to be dipped in liquid of the bath.

Thereafter, the controller 100 drives the wafer chuck at high, intermediate, and low speed in accordance with the recorded number of pulses. As mentioned above, the step motors are used to control the movement of the wafer chuck, thereby making it possible to control fine movement of the wafer chuck shown in FIGS. 13A to 13E.

Figure 18:
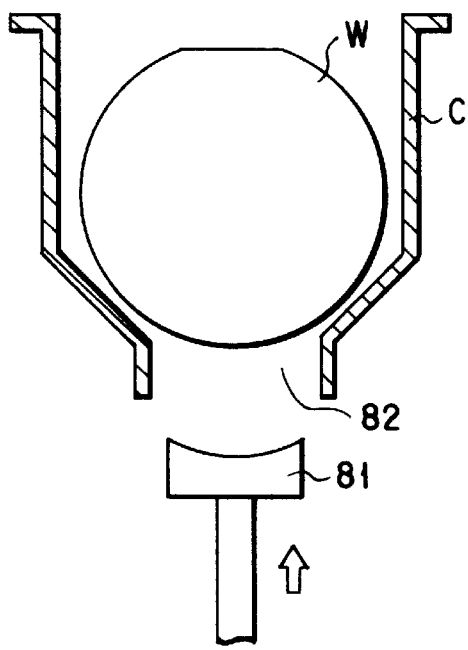
FIG. 18 is a view showing a state just before the wafer of a carrier is lifted up by a lifting-up member.

In the above-mentioned cleaning machine 1, there is executed the process in which only wafers W are lift up from the carrier C by the lifting-up device, which is provided in the alignment section 6. As shown in FIG. 18, this kind of lifting-up device comprises lifting-up members 81. The lifting-up members 81 can be moved up and down. On the surface of each of the lifting-up member 81, a predetermined number of holding notches, for example, 25 holding notches are formed to hold wafers. For lifting up wafers W, each of lifting-up member 81 rises to be inserted to an opening 82 formed at a lower surface of the carrier C. The wafers W of the carrier C are held by the holding notches of the lifting-up members 81. In this state, the lifting-up member 81 further rises, so that wafers W are lifted up from the carrier C. Also, there is proposed a method in which the carrier C is moved down, so that the lifting-up member 81 is substantially moved up so as to lift up wafers W.

Figure 19:
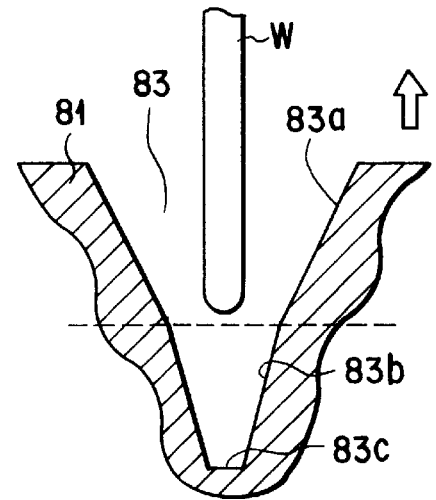
FIG. 19 is a view explaining a cross section of the two-stage tapered holding notch which can be applied to a holding notch of the lifting-up member of FIG. 18.

In either case, the holding notches of the lifting-up member 81 may be structured by holding notches 83 whose cross section is formed to be two-stage tapered as shown in FIG. 19. In the structure of the holding notches 83, an opening angle of an upper taper part 83*a*, which is positioned at the opening side, is set to be larger than that of a lower taper part 83*b*, which is positioned at a notch bottom 83*c*.

In the above-mentioned lifting-up operation, the speed of the lifting-up movement may be suitably changed. For example, as shown in FIG. 19, wafers W may be lifted up at a relatively high speed until the lower peripheral edges of wafers W of the carrier C enters the lower taper part 83*b*. Thereafter, wafers W may be lifted up at a relatively low speed until at least the lower peripheral edges of wafers W are supported by the holding notches 83.

By changing the speed of the lifting-up movement, damage, which is caused by the contact between the lower peripheral edge of wafer W and the inner wall of the holding notches 83, and the generation of particles can be restrained, thereby wafers W can be rapidly lifted up.

Also, similar to the case that the wafers W are mounted on the wafer chuck 15 from the boat 51 of the bath, the mounting speed may be changed in mounting the lifted-up wafers W on the wafer chuck 14.

As mentioned above, according to the structure of the present invention, the cross section of the holding notches of the upper holder is shaped to be two-stage tapered to prevent the tilt of the to-be-processed object. Due to this, the to-be-processed objects can be smoothly received. Then, after receiving the to-be-processed objects, since the peripheral edge of each of the to-be-processed objects enters the second taper part whose opening angle is small, clearance between the adjacent to-be-processed objects can be suitably maintained. Therefore, the contact between the adjacent to-be-processed objects can be prevented, and the to-be-processed objects can be smoothly mounted on the other parts.

Moreover, the moving speed of the holding members of the transfer machine is set in accordances with the circumstances. Due to this, the to-be-processed objects can be rapidly transferred in the range that the generation of particles is prevented and the to-be-processed objects themselves are not damaged. Thereby, the yield and throughput can be improved. In addition to such advantages, clearance between the adjacent to-be-processed objects can be suitably maintained, the contact between the adjacent to-be-processed objects can be prevented, and the to-be-processed objects can be smoothly mounted on the other parts.

Furthermore, since the lower taper part of the holding notches of the holding unit is deeply formed, there is no possibility that the to-be-processed object held by the holding unit will become detached, so that the problem of the so-called jump throttle can be solved.

Moreover, in lifting up only the to-be-processed objects from the containing member, the rapid and safe lifting-up of the to-be-processed objects can be realized.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A transfer machine comprising:

a pair of holding members which oppose each other to hold a plurality of objects at their peripheral edges;

a drive mechanism for selectively driving said holding members toward and away from each other in order to selectively execute holding and releasing of said objects by said holding members; and a transfer mechanism for transferring said objects and said holding members to a bath in order to process said objects in said bath, wherein each of said holding members has upper and lower holders and wherein each of the upper and lower holders has a plurality of holding notches for holding peripheral edges of said objects, and wherein each holding notch of each upper holder has a first taper part positioned adjacent to an opening of the holding notch and a second taper part positioned adjacent to a bottom of the holding notch and extending from said first taper part, and wherein with respect to a line bisecting said holding notch a first angle extends between said line and a side wall of said holding notch in said first taper part and a second angle extends between said line and the side wall of said holding notch in said second taper part, and wherein said first angle is larger than said second angle such that said first taper part has an opening angle larger than an opening angle of said second taper part.

2. The transfer machine according to claim 1, wherein each of said holding members includes a frame which is attached to said dive mechanism, a pair of stays vertically extend from end portions of said frame, and said upper and lower holders are formed of a pair of bar-shaped members fixed to lower end portions of said stays such that said bar-shaped members extend parallel to each other between said stays.

3. The transfer machine according to claim 1, wherein said first angle is from 25° to 35°, and said second angle is from 5° to 20°.

4. The transfer machine according to claim 1, wherein the notch bottom extends adjacent to said second taper part, and the notch bottom has a radius of curvature of 0.3 to 0.8 mm.

5. The transfer machine according to claim 1, wherein said holding notches of said lower holder are V-shaped holding notches, with an angle between side walls of said V-shape holding notches being in a range of 40° to 70°.

6. The transfer machine according to claim 1, wherein said transfer mechanism includes means for moving said objects down to transfer the objects to a first position with respect to said bath at a first speed, and to a second position with respect to said bath from said first position at second speed slower than said first speed, to thereby transfer said objects to said bath.

7. The transfer machine according to claim 6, wherein said means for moving moves said holding members to a third position from said second position close to a boat at a third speed slower than said second speed, to thereby transfer said objects of said holding members to said boat for holding said objects in said bath.

8. The transfer machine according to claim 7, wherein said drive mechanism has means for releasing said holding members such that said objects are separated from said holding members when said holding members are transferred to said third position.

9. The transfer machine according to claim 7, wherein said transfer machine includes means for moving said holding members upward with said holding members in a release state at which objects are not held by said holding members.

10. A transfer method comprising the steps of:

(a) holding a plurality of objects by a pair of holding members each having a first holding element and a second holding element, said first holding element having a plurality of holding notches for supporting said plurality of objects and said second holding element having a plurality of holding notches each having a first taper part and a second taper part extending from said first taper part, wherein said first taper part is positioned adjacent to an opening of the holding notch to maintain an arrangement of said objects and said second taper part is positioned adjacent to a notch bottom, and wherein with respect to a line bisecting the holding notch a first angle extends between said line and a side wall of said holding notch in said first taper part and a second angle extends between said line and the side wall of said holding notch in said second taper part, and further wherein said first angle is larger than said second angle such that said second taper part has an opening angle smaller than said first taper part for holding the peripheral edges of said objects;

(b) moving said objects held by said holding members down to a first position with respect to bath from an initial position at a first speed so that said objects can be processed in said bath; and (c) moving said objects down to a second position from said first position at a second speed slower than said first speed.

11. The transfer method according to claim 10, further including moving said holding members down from said second position to a third position close to a boat at a third speed slower than said second speed so that said objects held by said holding members are transferred to said boat for holding said objects in said bath.

12. The transfer method according to claim 11, further comprising releasing said holding members to separate said objects from said holding members when said holding members are at said third position.

13. The transfer method according to claim 12, further comprising moving said holding members upward with said holding members in a release state in which objects are not held by said holding members.

14. The transfer method according to claim 13, further comprising moving said holding members down at said first speed until said holding members enter said bath after processing said objects in said bath, and moving said holding members to said third position of said bath at said second speed slower than said first speed after said holding members enter said bath, holding said objects by said holding members after said holding members are stopped, moving said holding members to said second position from said third position at a fourth speed, then moving said holding members to said first position at a fifth speed faster than said fourth speed, and then moving said holding members to said initial position from said first position at a sixth speed faster than said fifth speed.

15. The transfer method according to claim 11, further comprising a step of inserting each of said objects into a plurality of holding notches of a boat, wherein said boat is disposed in said bath at said third position, and wherein said boat comprises at least two first holding units having a plurality of holding notches for supporting said objects, and a second holding unit, positioned between said two first holding units, said second holding unit having a plurality of holding notches each having a first taper part and a second taper part, said first taper part positioned adjacent an opening of the holding notch to maintain an arrangement of said objects, said second taper part positioned adjacent to a notch bottom and having an opening angle smaller than an opening angle of said first taper part.

16. A cleaning machine comprising:
a pair of holding members which oppose each other to hold a plurality of objects at their peripheral edges;
a drive mechanism for selectively driving said holding members toward and away from each other in order to selectively execute holding and releasing of said objects;
a bath filled with a cleaning solution;
a transfer mechanism for transferring said objects and said holding members to said bath in order to clean said objects in said bath; and
cleaning execution means for executing a cleaning process of said objects transferred to said bath,
wherein each of said holding members has upper and lower holders and wherein each of the upper and lower holders has a plurality of holding notches for holding the peripheral edges of said objects, and wherein each holding notch of each upper holder has a first taper part positioned adjacent to an opening of the holding notch and a second taper part positioned adjacent to a bottom of the holding notch and extending from said first taper part, and
wherein with respect to a line bisecting the holding notch a first angle extends between said line and a side wall of said holding notch in said first taper part and a second angle extends between said line and the side wall of said holding notch in said second taper part, and further wherein said first angle is larger than said second angle such that said first taper part has an opening angle larger than an opening angle of said second taper part.

17. The cleaning machine according to claim 16, wherein said cleaning execution means comprises means for flowing said cleaning solution in said bath.

18. A cleaning method comprising:
(a) holding a plurality of objects by a pair of holding members each having a first holding element and a second holding element, said first holding element having a plurality of holding notches for supporting said plurality of objects and said second holding element having a plurality of holding notches each having a first taper part and a second taper part extending from said first taper part, wherein said first taper part is positioned adjacent to an opening of the holding notch to maintain an arrangement of said objects and said second taper part is positioned adjacent a bottom of the holding notch, and wherein with respect to a line bisecting the holding notch a first angle extends between said line and a side wall of said holding notch in said first taper part and a second angle extend between said line and the side wall of said holding notch in said second taper part, and further wherein said first angle is larger than said second angle such that said second taper part has an opening angle smaller than said first taper part for holding the peripheral edges of said objects;
(b) moving said objects held by said holding members down from an initial position to a first position corresponding to a liquid surface of a cleaning solution of a bath at a first speed;
(c) moving said objects into the cleaning solution from said first position to a second position of said bath at a second speed slower than said first speed;
(d) unloading said objects from said holding members by moving said holding members at a third speed slower than said second speed to a position for unloading the objects onto a boat disposed in said processing bath; and
(e) cleaning said to-be-processed objects held by said boat.

19. The cleaning method according to claim 18, wherein said boat comprises at least two first holding units having a plurality of holding notches for supporting said objects, and a second holding unit, positioned between said first holding units, said second holding unit having a plurality of holding notches each having a first taper part and a second taper part, said first taper part positioned adjacent to an opening of the holding notch to maintain an arrangement of said objects, said second taper part positioned adjacent to a bottom of the holding notch and having an opening angle smaller than said first taper part.

20. A cleaning machine comprising:
a pair of holding members which oppose each other to hold a plurality of objects at their peripheral edges;
a bath filled with a cleaning solution;

a boat disposed in said bath for holding said plurality of objects in said bath;

a drive mechanism for selectively moving said pair of holding members toward and away from each other to selectively hold and release said plurality of objects; and a transfer mechanism for moving said pair of holding members toward and away from said boat to deposit said plurality of objects in said boat and to remove said plurality of objects from said boat;

wherein at least one of said boat and said pair of holding members includes a plurality of notches for holding objects with each notch having a first taper part adjacent a notch opening and a second taper part adjacent a notch bottom, and wherein with respect to a line bisecting each notch, a first angle extends between said line and a notch side wall in said first taper part and a second angle extends between said line and the notch side wall in said second taper part, and further wherein said first angle is larger than said second angle such that said first taper part has an opening angle larger than an opening angle of said second taper part.

21. A cleaning machine as recited in claim 20, wherein each of said pair of holding members and said boat includes a plurality of said notches having said first taper part and said second taper part.

22. A cleaning machine as recited in claim 21, wherein each of said pair of holding members and said boat includes a further plurality of notches, and wherein each notch of said further plurality of notches has an angle between a line bisecting the notch and a side wall of the notch, with said angle substantially constant along a depth of the notch from a notch opening to a notch bottom.

* * * * *